(12) United States Patent
Raina et al.

(10) Patent No.: US 9,069,042 B2
(45) Date of Patent: Jun. 30, 2015

(54) EFFICIENT APPARATUS AND METHOD FOR TESTING DIGITAL SHADOW LOGIC AROUND NON-LOGIC DESIGN STRUCTURES

(71) Applicant: Freescale Semiconductor, Inc., Austin, TX (US)

(72) Inventors: Rajesh Raina, Austin, TX (US); Magdy S. Abadir, Austin, TX (US); Darrell L. Carder, Dripping Springs, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 121 days.

(21) Appl. No.: 14/072,295

(22) Filed: Nov. 5, 2013

(65) Prior Publication Data

US 2015/0128001 A1    May 7, 2015

(51) Int. Cl.
  *G01R 31/28* (2006.01)
  *G01R 31/3177* (2006.01)
(52) U.S. Cl.
  CPC ................... *G01R 31/3177* (2013.01)
(58) Field of Classification Search
  CPC ............. G01R 31/31704; G01R 31/318314; G01R 31/318364; G01R 31/318583
  USPC .................... 714/718, 742, 733, 726
  See application file for complete search history.

(56) References Cited

U.S. PATENT DOCUMENTS

| | | | |
|---|---|---|---|
| 4,380,866 A | 4/1983 | Countryman, Jr. et al. | |
| 4,513,494 A | 4/1985 | Batra | |
| 5,386,380 A | 1/1995 | Chen et al. | |
| 6,088,823 A | 7/2000 | Ayres et al. | |
| 7,062,598 B1 | 6/2006 | Lapidus et al. | |
| 7,134,063 B2 | 11/2006 | Cho et al. | |
| 7,284,178 B2 * | 10/2007 | Belzile et al. | 714/742 |
| 7,340,658 B2 | 3/2008 | Seuring | |
| 7,441,164 B2 * | 10/2008 | Guettaf | 714/718 |
| 7,475,314 B2 | 1/2009 | Chhabra et al. | |
| 7,913,138 B2 * | 3/2011 | Sawamura | 714/731 |
| 2002/0064175 A1 * | 5/2002 | Traverso et al. | 370/442 |
| 2011/0271156 A1 | 11/2011 | Chhabra | |
| 2013/0007548 A1 * | 1/2013 | Kohli | 714/738 |

OTHER PUBLICATIONS

Richard McGowen et al., A Study of Undetectable Non-Feedback Shorts for the Purpose of Physical-DFT, European Design and Test Conference, 1994. EDAC, The European Conference on Design Automation. ETC European Test Conference. EUROASIC, The European Event in ASIC Design, Proceedings, Feb. 28-Mar. 3, 1994.

(Continued)

*Primary Examiner* — David Ton
(74) *Attorney, Agent, or Firm* — Terrile, Cannatti, Chambers & Holland, LLP; Michael Rocco Cannatti

(57) ABSTRACT

A circuit for efficiently testing digital shadow logic (504, 514) in isolation from an associated non-logic design structure (510) includes a width and delay matched bypass circuit (520) coupled to receive an n-bit input from shadow logic (504) and to generate therefrom an m-bit test output which is selectively connected to replace an m-bit output to the shadow logic (514) from the non-logic design structure (510) in a shadow logic test mode, thereby flexibly emulating the non-logic design structure to allowing separate isolated tests on the shadow logic and on the non-logic design structure.

20 Claims, 4 Drawing Sheets

(56) References Cited

OTHER PUBLICATIONS

Mike Ricchetti, Draft, Wrapper Interface Port (WIP), Wrapper Instruction Register (WIR) and Wrapper Bypass, IEEE P1500 Embedded Core Test, Aug. 28-29, 2000, http://grouper.ieee.org/groups/1500/aug00/wir.pdf.

Xiangqiu Yu et al., Test Generation for Redundant Faults in Combinational Circuits by Using Delay Effects, Proceedings of the Third Asian Test Symposium, Nov. 15-17, 1994, pp. 107-112.

\* cited by examiner

EFFICIENT APPARATUS AND METHOD FOR TESTING DIGITAL SHADOW LOGIC AROUND NON-LOGIC DESIGN STRUCTURES

BACKGROUND OF THE INVENTION

1. Field of the Invention

The present invention is directed in general to field of integrated circuit verification. In one aspect, the present invention relates to testing of shadow logic in an integrated circuit.

2. Description of the Related Art

As the complexity and density of integrated circuits increases, the challenges required for testing the circuit also increases, thereby increasing the complexity, time, and costs for the total design effort. For example, integrated circuits increasingly include non-logic structures (e.g., memory blocks, fuses, analog blocks, and/or proprietary design blocks) which are surrounded by shadow logic (e.g., the gates and logic circuits surrounding the non-logic or memory block structures). While industry standard tests, such as built-in self test (BIST) or built-in test (BIT) mechanisms, can be used to test the non-logic structures, such tests do not provide complete test coverage for the shadow logic. In addition, conventional testing mechanisms do not separately test the shadow logic in isolation or independently from the non-logic structures, so instead a built-in test circuit typically tests the non-logic block and ignores the shadow logic. Attempts to separately test the shadow logic by including a scan wrapper around the non-logic structure can degrade performance of the system by increasing the number of access cycles. In the case of integrated circuits incorporating logic and non-logic functions, additional problems may occur when testing shadow logic around programmable non-logic structures. For example, a non-logic block, such as a read only memory, may be programmed in a first state to generate a restricted range of test inputs that can be applied to downstream shadow logic, resulting in undetected defects in the shadow logic that can reduce reliability. To overcome this limitation in case the non-logic block is re-programmed in a second state, scan tests must be regenerated to re-test the shadow logic.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

Figure 1:
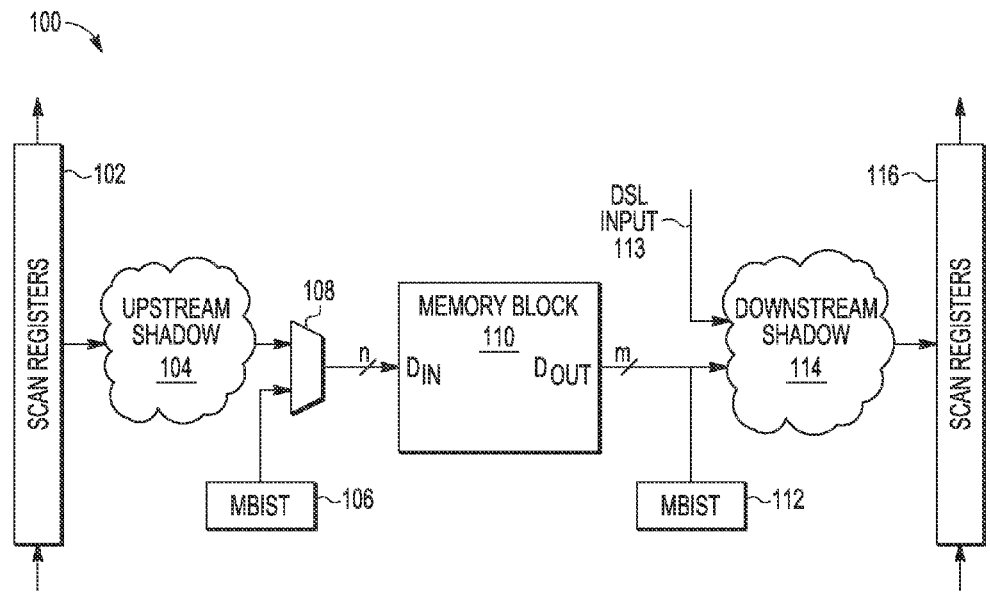
FIG. 1 illustrates a block diagram of a memory block and surrounding digital shadow logic circuitry with memory built-in self-test circuitry arranged to test the memory block.

An integrated circuit testing apparatus and methodology are described for efficiently testing shadow logic surrounding a non-logic circuit block by providing a programmable width and delay matched bypass circuit between shadow logic under test to flexibly emulate the non-logic circuit block, thereby allowing separate isolated tests on the shadow logic and on the non-logic circuit block without incurring a large silicon area penalty. As used herein, shadow logic may refer to components. such as gates or logic circuits, which surround non-logic circuits, such as memory blocks, embedded core(s), fuse circuitry, analog circuitry, and/or proprietary design circuitry. For example, shadow logic may be user defined logic (UM) that accessible from the input/output ports of an embedded core, in which case the core is said to cast a shadow which potentially reduces the testability of the logic in that shadow. With selected embodiments of the programmable bypass circuit and test method, shadow logic around the non-logic circuit block can be efficiently tested to provide complete test coverage of the shadow logic without degrading performance of the non-logic circuit block, without requiring regeneration of scan tests after reprogramming the non-logic circuit block, and without requiring extra inputs to the bypass circuit. By including bypass multiplexer and delay circuits (alone or in combination with external signal inputs and/or logic block controls) in the bypass circuit to match the width and delay of the non-logic circuit block, a bypass mode for the associated non-logic circuit block (e.g., a read only memory) may be used in combination with scan test circuitry to independently control all inputs to the shadow logic and observe all shadow logic outputs during scan testing to provide complete test coverage for the shadow logic.

In this disclosure, an improved test circuit design and method of operation are described for efficiently testing shadow logic independently from the associated non-logic circuitry to address various problems in the art where various limitations and disadvantages of conventional solutions and technologies will become apparent to one of skill in the art after reviewing the remainder of the present application with reference to the drawings and detailed description provided herein. It will be understood that the circuit block diagram and/or flowchart illustrations described herein can be implemented in whole or in part by dedicated hardware circuits, firmware and/or computer program instructions which are provided to a processor of a general purpose computer, special purpose computer, or other programmable data processing apparatus to produce a machine, such that the instructions (which execute via the processor of the computer or other programmable data processing apparatus) implement the functions/acts specified in the flowchart and/or block diagram block(s). In addition, while various details are set forth in the following description, it will be appreciated that selected embodiments of present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Such descriptions and representations are used by those skilled in the art to describe and convey the substance of their work to others skilled in the art. In addition, some portions of the detailed descriptions provided herein are presented in terms of algorithms or operations on data within a computer memory. Such details are well known and not considered necessary to teach one skilled in the art of how to make or use the present invention. Various illustrative embodiments of the present invention will now be described in detail with reference to the accompanying figures.

Turning now to FIG. 1, there is illustrated a block diagram of an integrated circuit system 100 which includes a memory block 110 that is surrounded by input digital shadow logic 104 and output digital shadow logic 114 with memory built-in self-test circuitry 106, 112 arranged to test the memory block 110. The upstream shadow logic 104 is coupled to provide an n-bit input to the memory block 110 via an input multiplexer circuit 108 which also receives inputs from a first MBIST controller block 106. At the output of the memory block 110, the m-bit output is conveyed to the downstream shadow logic 114 and also to a second MBIST controller block 112. The downstream shadow logic 114 receives the m-bit data output from the memory block 110 and additional downstream shadow logic (DSL) input(s) 113 for purposes of interfacing the memory data with other circuits (not shown) connected thereto. In this arrangement, data from an external device is received by upstream shadow 104, where it is processed (e.g., translated, formatted, buffered, etc.) for storage into memory block 110. The memory block 110 provides an example of a non-logic design structure for storing retrievable data in an array of storage cells which may be organized to be accessible via column and row addresses, though it will be appreciated that other types of non-logic design structures may also be used, including but not limited to random access memory, read only memory, fuse circuit, analog circuits, and/or proprietary design circuits. The downstream shadow 114 retrieves and interfaces the data from memory block 110 with external circuits (not shown). The MBIST controller blocks 106, 112 are coupled between upstream shadow 104 and downstream shadow 114 and the memory block 110 to provide Built-In Self-Test (BIST) accessibility and observability to the inputs and outputs of memory block 110. Scan chains 102, 116 may also be provided as an input and output set of data storage registers which are configured for test mode as a serial shift register for direct access from an external tester (not shown). In operation, the scan chains 102, 116 may be used to attempt testing the upstream shadow 104 and downstream shadow 114 through the memory block 110. In addition, the MBIST controller blocks 106, 112 function by supplying test vector data into and comparing results out of the memory block 110 for purposes of testing the memory block 110, but not the shadow logic 104, 114. In a typical implementation, the scan tests used to test the shadow logic provide incomplete test coverage, and must also be regenerated in the event that the read-only memory block (ROM) 110 is reprogrammed or otherwise has its functional state altered.

Figure 2:
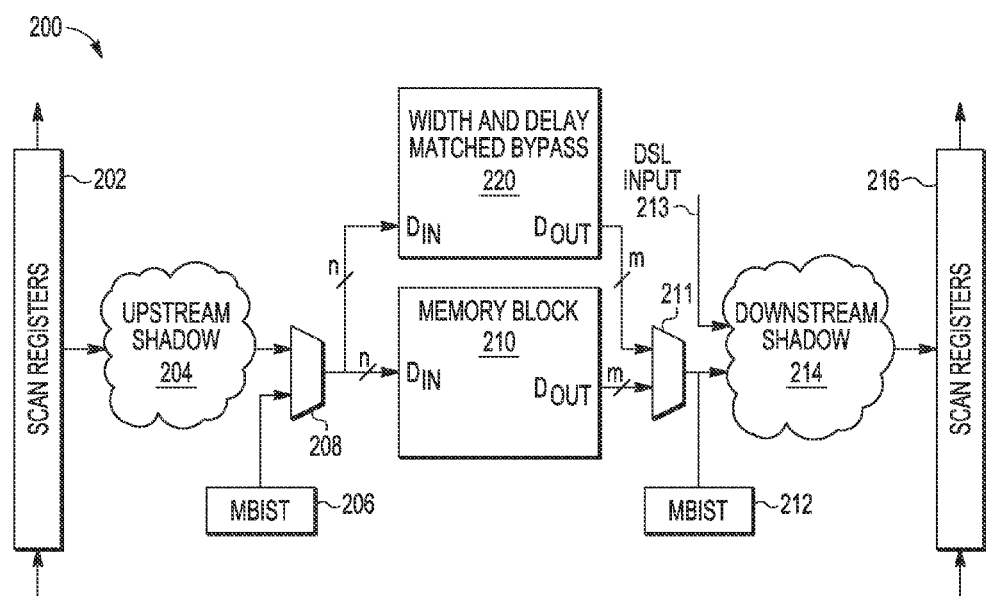
FIG. 2 illustrates a block diagram of a memory block and surrounding digital shadow logic circuitry with a memory block matching bypass circuit for testing the digital shadow logic circuitry in accordance with selected embodiments of the disclosure.

To overcome these and other disadvantages associated with conventional shadow logic testing schemes, there is disclosed herein a memory block matching bypass circuit and methodology for testing digital shadow logic circuitry which allows the detection and observation of errors within the shadow logic independent of the circuitry of the associated memory block. For example, FIG. 2 illustrates a block diagram of an integrated circuit system 200 which includes a memory block 210 and surrounding digital shadow logic circuitry 204, 214 with a memory block matching bypass circuit 220 for testing the digital shadow logic circuitry 204, 214 in accordance with selected embodiments of the disclosure. In selected embodiments, the memory block matching bypass circuit 220 includes one or more bypass multiplexer circuits, delay circuits, external signal inputs, and/or logic control blocks to match the width and delay of the memory block 210. For example, with an n-input, m-output memory block 210 having a specified propagation delay, the memory block matching bypass circuit 220 may be configured as an n-input, m-output bypass circuit having the same specified propagation delay. In selected embodiments, delay matching may use buffers and/or flip-flop devices in the memory block matching bypass circuit 220 to achieve cycle count matching. In operation, the memory block matching bypass circuit 220 provides a memory block bypass function which maps memory block input data ($D_{IN}$) (e.g., address, write, and control line values) to memory block output data ($D_{OUT}$) (e.g., read line values from the memory block 210). In addition, the memory block matching bypass circuit 220 allows the propagation of all possible logic values so that any logic components between the inputs and outputs of the memory block 210 as well as the adjacent scan flip-flops can be readily tested. With this bypass function, the memory block matching bypass circuit 220 allows the detection and observation of errors within shadow logic circuitry 204, 214 independent of the circuitry of the memory block 210 so that the observation does not occur through the memory cells of memory block 210. In the illustrated system 200, the upstream shadow logic 204 is coupled to provide an n-bit input to the both the memory block 210 and the memory block matching bypass circuit 220 through the input multiplexer circuit 208 Which also receives inputs from a first MBIST controller block 206. In turn, the memory block 210 and memory block matching bypass circuit 220 are each coupled to provide an m-bit output through the output multiplexer circuit 211 to the downstream shadow logic 214 and also to a second MBIST controller block 212. The downstream shadow logic 214 receives the m-bit data output from the output multiplexer circuit 211 and additional DSL input(s) 213 for purposes of interfacing with other circuits. Through appropriate control of the input and output multiplexer circuits 208, 211, the downstream shadow logic 214 receives the m-bit data output from the memory block 210 during a first test or operational mode for testing or operating the memory block, and receives the m-bit data output from the memory block matching bypass circuit 220 during a second test mode for testing the shadow logic.

To test the memory block 210, test data is applied to the memory block 210 from the first MBIST controller block 206 using the input multiplexer circuit 208, and then multiplexed out to the second MBIST controller block 212 using the output multiplexer circuit 211. To enable testing of the shadow logic 204, 214, test data is applied to the upstream shadow logic 204 via scan register chain 202, propagated through the circuits of upstream shadow logic 204, memory block matching bypass circuit 220 (using the input multiplexer circuit 208), and downstream shadow logic 214 (using the output multiplexer circuit 211), and then scanned out via scan register chain 216. In this manner, the memory block matching bypass circuit 220 provides for isolated testing of the digital shadow logic circuitry 204, 214 with respect to memory block 210. In addition, the memory block matching bypass circuit 220 provides an enhanced flexibility in performing scan tests of the digital shadow logic circuitry 204, 214 without regard to the relative sizes of the memory block inputs and outputs or even the programmed functionality of the memory block 210, thereby providing complete test coverage and eliminating the need to regenerate scan tests for the shadow logic when the memory block is reprogrammed.

During testing of the shadow logic 204, 214, the bypass routing through the memory block matching bypass circuit 220 eliminates the need to emulate or surround the memory block 210 with additional scannable registers which add cost, complexity, and delay. Indeed, the inclusion of a width-matched and delay-matched memory block matching bypass circuit 220 allows the memory block access times (e.g., 1 or 2 cycles) to be retained with minimal additional cost associated with the bypass multiplexers 208, 211 and any associated multiplexer delay.

By properly configuring the memory block matching bypass circuit 220, complete test coverage of the digital shadow logic circuitry 204, 214 can be obtained by controlling all inputs to the shadow logic and observing the shadow logic outputs. For example, the input scan register chain 202 may be used to independently control the inputs to the input show logic 204, and in conjunction with the memory block matching bypass circuit 220 may be used to independently control the inputs to the output show logic 214. In addition, the output scan register chain 216 may be used to observe all outputs from the digital shadow logic circuitry 204, 214 independently of the programmed functionality of the memory block 210 by virtue of the bypass function provided by the memory block matching bypass circuit 220.

To provide the required input control and output observability in cases where the number of memory block inputs matches the number of memory block outputs (e.g., n=m), the memory block matching bypass circuit 220 may be configured to directly map the inputs to the outputs (e.g., $D_{OUT}[k]=D_{IN}[k]$; k=1:n), where the memory block inputs may include memory address, write, clock, read enable, and/or other control line values, while the memory block output values may include memory output data values. In this configuration, each of the memory block inputs $D_{IN}[k]$ bypasses the memory block 210 through the memory block matching bypass circuit 220, and is multiplexed into the downstream shadow logic circuitry 214 through the output multiplexer circuit 211.

To provide the required input control and output observability in cases where the number of memory block inputs is less than the number of memory block outputs (e.g., n<m), the memory block matching bypass circuit 220 may be configured to directly map the "n" inputs to "n" of the "m" outputs (e.g., $D_{OUT}[k]=D_{IN}[k]$; k=1:n), and to generate "m-n" additional data (AD) outputs from other sources (e.g., $D_{OUT}[k]=AD[k]$; k+1:m). For example, the additional "m-n" outputs may be retrieved from the output scan register chain 216 or other flip-flop storage from downstream shadow logic, or may be internally generated using bypass logic at the memory block matching bypass circuit 220. In this configuration, each of the "n" memory block inputs $D_{IN}[k]$ bypasses the memory block 210 through the memory block matching bypass circuit 220 where an additional "m-n" outputs are generated and multiplexed (with the "n" memory block inputs) into the downstream shadow logic circuitry 214 through the output multiplexer circuit 211.

To provide the required input control and output observability in cases where the number of memory block inputs is greater than the number of memory block outputs (e.g., n>m), the memory block matching bypass circuit 220 may be configured with an exclusive-OR reducer network to uniquely map the "n" inputs to "m" outputs (e.g., $D_{OUT}[k]=D_{IN}[k]$ XOR $D_{IN}[k+m]$ XOR $D_{IN}[k+2m]$; k=1:m), thereby reducing the "n" inputs to "m" outputs. Of course, any desired XOR reducer network or other combinatorial logic function may be used. In this configuration, one or more of the "n" memory block inputs $D_{IN}[k]$ is logically combined with one or more additional memory block inputs by the memory block matching bypass circuit 220 to generate "m" outputs from the "n" memory block inputs so that the "m" outputs are multiplexed into the downstream shadow logic circuitry 214 through the output multiplexer circuit 211.

Figure 3:
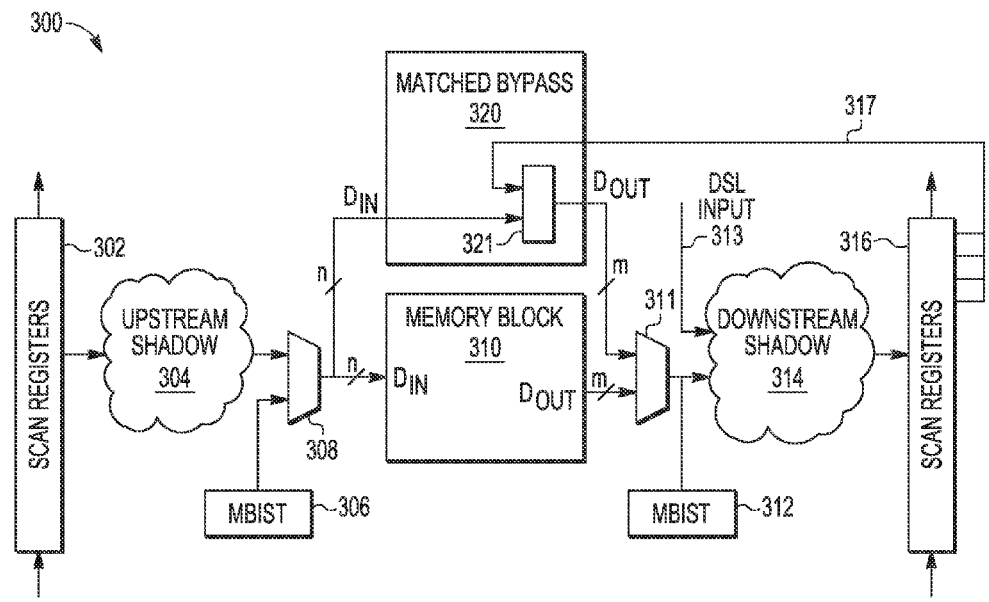
FIG. 3 illustrates a block diagram of a memory block and surrounding digital shadow logic circuitry with a memory block matching bypass circuit which multiplexes scan register values from downstream shadow logic into remaining memory block outputs when testing the digital shadow logic circuitry in accordance with selected embodiments of the disclosure where the memory block input width is less than the memory block output width.

To provide additional details for better understanding selected embodiments of the present disclosure, reference is now made to FIG. 3 which illustrates a block diagram of an integrated circuit system 300 which includes a memory block 310 and surrounding digital shadow logic circuitry 304, 314 with a memory block matching bypass circuit 320 for testing the digital shadow logic circuitry 304, 314. In the illustrated system 300, the upstream shadow logic 301 is coupled to provide an n-bit input to the both the memory block 310 and the memory block matching bypass circuit 320 through the input multiplexer circuit 308 which also receives inputs from a first MBIST controller block 306. In turn, the memory block 310 and memory block matching bypass circuit 320 are each coupled to provide an m-bit output through the output multiplexer circuit 311 to the downstream shadow logic 311 and also to a second MBIST controller block 312. The downstream shadow logic 314 receives the m-bit data output from the output multiplexer circuit 311 and additional DSL input(s) 313 for purposes of interfacing with other circuits. The memory block matching bypass circuit 320 is connected to bypass the memory block 310 by input multiplexer circuit 308 and output multiplexer circuit 311. To test the memory block 310, test data may be applied to the memory block 310 from the first MBIST controller block 306 using the input multiplexer circuit 308, and then multiplexed out to the second MBIST controller block 312 using the output multiplexer circuit 311. To separately test the shadow logic 304, 314, test data may be applied to the upstream shadow logic 304 via scan register chain 302, propagated through the circuits of upstream shadow logic 304, memory block matching bypass circuit 320 (using the input multiplexer circuit 308), and downstream shadow logic 314 (using the output multiplexer circuit 311), and then scanned out via scan register chain 316.

In selected embodiments, flexible scan testing of the digital shadow logic circuitry 304, 314 is provided by configuring the n-input, m-output memory block matching bypass circuit 320 with one or more bypass multiplexer circuits, delay circuits, external signal inputs, and/or logic control blocks to match the width and delay of the n-input, m-output memory block 310. In selected embodiments, delay matching may use buffers and/or flip-flop devices in the memory block matching bypass circuit 320 to achieve cycle count matching, and may also combine one or more external signals at a combiner circuit 321 to achieve width matching at the output bus ($D_{OUT}$) by using, for example, scan register values from downstream shadow logic when the memory block input width "n" is less than the memory block output width "m." In such cases where n<m, there are m-n additional output values that must be generated by the memory block matching bypass circuit 320. To this end, the memory block matching bypass circuit 320 may be configured to directly pass the "n" inputs to "n" of the "m" outputs through the combiner 321 so that $D_{OUT}[k]=D_{IN}[k]$; k=1:n. In addition, the memory block matching bypass circuit 320 may be configured to retrieve the additional "m-n" output values from an external source. For example, one or more signal feedback paths 317 may be used to retrieve "m-n" register values from one or more downstream shadow logic scan registers which are then passed to "m-n" additional data (AD) outputs through the combiner 321 so that $D_{OUT}[k]=AD[k]$; k=n+1:m. In this configuration, each of the "n" memory block inputs $D_{IN}[k]$ bypasses the memory block 310 and is passed through the memory block matching bypass circuit 320 and through the combiner 321 with the additional "m-n" outputs retrieved from an external source (e.g., the scan register chain 316). As will be appreciated, the combiner 321 may be implemented with any desired circuitry that groups signals obtained from various sources into a single bus, and need not contain any logic gates.

Figure 4:
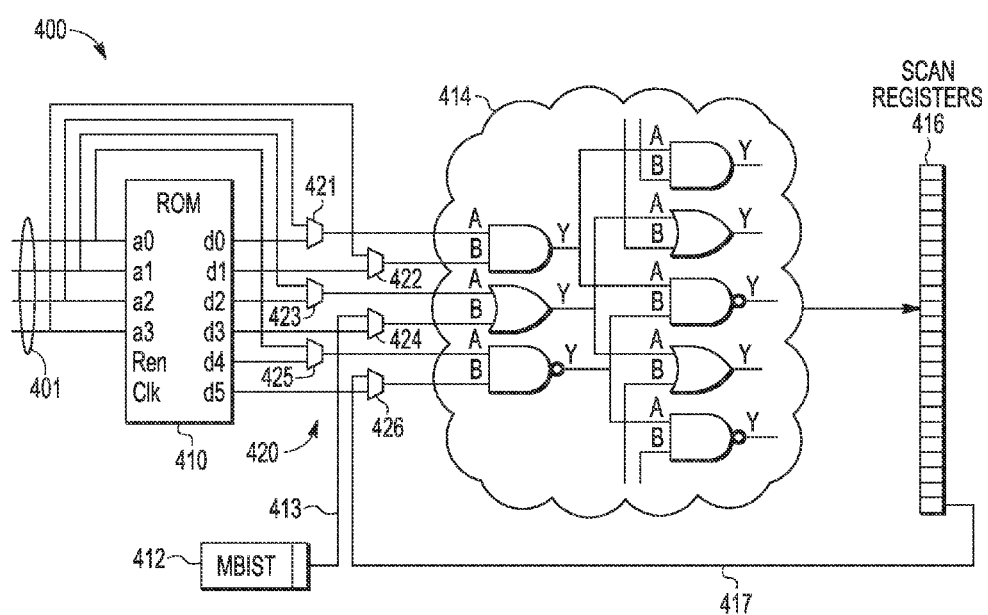
FIG. 4 illustrates a circuit schematic example of a read only memory and downstream shadow logic circuitry with a memory block matching bypass circuit which multiplexes scan register values from downstream shadow logic circuitry into remaining read only memory outputs.

For additional embodiment details, reference is now made to FIG. 4 which illustrates a simplified circuit schematic diagram of an integrated circuit system 400 which includes a read only memory 410 and memory block matching bypass circuit 420 coupled to downstream shadow logic circuitry 414. In the example embodiment, the memory block matching bypass circuit 420 embodies multiple bypass multiplexers 421-426 for bypassing "n" ROM inputs around the ROM 410 and for generating one or more additional ROM output values to the downstream shadow logic 414. In addition, the depicted downstream shadow logic 414 embodies a plurality of logic gate (e.g., AND, OR, and/or NAND gates) for interfacing between the ROM 410 and external circuitry. While the downstream shadow logic 414 may embody any desired combinatorial logic function, it will be understood by those skilled in the art that the depicted downstream shadow logic 414 includes two tiers of eight logic gates connected in a logic circuit characterized by 74 total stuck-at faults which is an industry standard fault model used by fault simulators and automatic test pattern generation (ATPG) tools to mimic a manufacturing defect within an integrated circuit. To independently test the downstream shadow logic 414, input test data 401 (e.g., that is generated by upstream shadow logic) is routed by input multiplexer circuitry (not shown) to bypass the ROM 410 and propagate through the multiplexer circuits 421-426 of the memory block matching bypass circuit 420. As illustrated, the bypass circuit 420 is embodied as a plurality of bypass multiplexers 421, 422, 423 and 425 for directly passing the "n" inputs a2, a3, a1, a0 to "n" of the "m" ROM outputs d0, d1, d2, d4, along with one or more additional multiplexers for multiplexing external values d3, d5 to the downstream shadow logic 414. For example, a first additional multiplexer 424 may retrieve an additional ROM output d3 along input line 413 from an MBIST controller block 412. In addition or in the alternative, a second additional multiplexer 426 may retrieve an additional ROM output using a feedback paths 417 from a downstream scan register 416 for ROM output d5. Using the bypass circuit 420 to bypass the ROM 410 in combination with one or more external signal inputs, a small and limited number of test vectors (e.g., 5) may be applied to detect all 74 stuck-at faults in the downstream shadow logic 414, thereby providing 100% test coverage with improved predictability of test coverage and test vector size.

Figure 5:
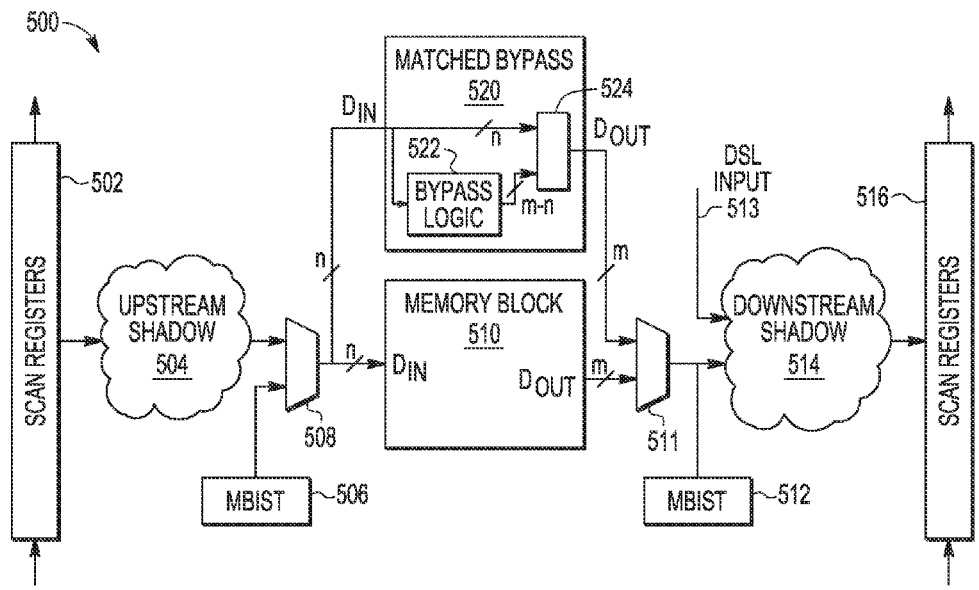
FIG. 5 illustrates a block diagram of a memory block and surrounding digital shadow logic circuitry with a memory block matching bypass circuit Which includes bypass logic for generating the most controllable inputs to downstream digital shadow logic circuitry when testing the digital shadow logic circuitry in accordance with selected embodiments of the disclosure where the memory block input width is less than the memory block output width.

To provide additional details for better understanding selected embodiments of the present disclosure, reference is now made to FIG. 5 which illustrates a block diagram of an integrated circuit system 500 which includes a memory block 510 and surrounding digital shadow logic circuitry 504, 514 with a memory block matching bypass circuit 520 which uses bypass logic to generate the most controllable inputs to downstream digital shadow logic circuitry when testing the digital shadow logic circuitry 504, 514. In the illustrated system 500, the upstream shadow logic 504 provides an n-bit input to the both the memory block 510 and the memory block matching bypass circuit 520 through the input multiplexer circuit 508 Which also receives inputs from a first MBIST controller block 506. In addition, the memory block 510 and memory block matching bypass circuit 520 are each coupled to provide an m-bit output through the output multiplexer circuit 511 to the downstream shadow logic 514 and also to a second MBIST controller block 512. In this configuration, the downstream shadow logic 514 receives the m-bit data output from the output multiplexer circuit 511 and additional DSL input(s) 513 for purposes of interfacing with other circuits. The memory block matching bypass circuit 520 is connected to bypass the memory block 510 by controlling the input and output multiplexer circuits 508, 511 so that, during testing of the shadow logic 504, 514, test data may be applied to the upstream shadow logic 504 via scan register chain 502, propagated through the circuits of upstream shadow logic 504, memory block matching bypass circuit 520 (using the input multiplexer circuit 508), and downstream shadow logic 514 (using the output multiplexer circuit 511), and then scanned out via scan register chain 516.

As described herein, flexible scan testing of the digital shadow logic circuitry 504, 514 is provided by configuring the n-input, m-output memory block matching bypass circuit 520 with bypass logic 522, a signal combiner 524, and any required delay circuits (not shown) to match the width and delay of the n-input, m-output memory block 510. In selected embodiments, buffers and/or flip-flop devices in the memory block matching bypass circuit 520 are used to achieve cycle count matching with the memory block 510. And in cases where the memory block input width "n" is less than the memory block output width "m" n<m), there are "m-n" additional output values that must be generated by the memory block matching bypass circuit 520. In such cases, the bypass logic 522 and combiner 524 are used to achieve width matching by applying bypass logic 522 to the "n" outputs from the upstream shadow logic 504 to generate "m-n" additional data (AD) outputs for input to the "m-n" most controllable inputs of the inputs of the downstream shadow logic 514. In addition, the memory block matching bypass circuit 520 may be configured to directly pass the "n" outputs from the upstream shadow logic 504 to the "n" least controllable inputs for the downstream shadow logic 514. Thus, instead of retrieving additional "m-n" data output values from one or more external sources, the memory block matching bypass circuit 520 internally generates the additional data output values without requiring extra inputs. For example, the "n" outputs from the upstream shadow logic 504 are sent to the combiner 524 and bypass logic 522 so that $D_{OUT}[k]=D_{IN}[k]$; k=1:n, and $D_{OUT}[k]=AD[k]$; k=n+1:m. In this configuration, each of the "n" memory block inputs $D_{IN}[k]$ bypasses the memory block 510 and is passed through the memory block matching bypass circuit 520 where they are combined 524 with the additional "m-n" outputs generated by the bypass logic 522.

Figure 6:
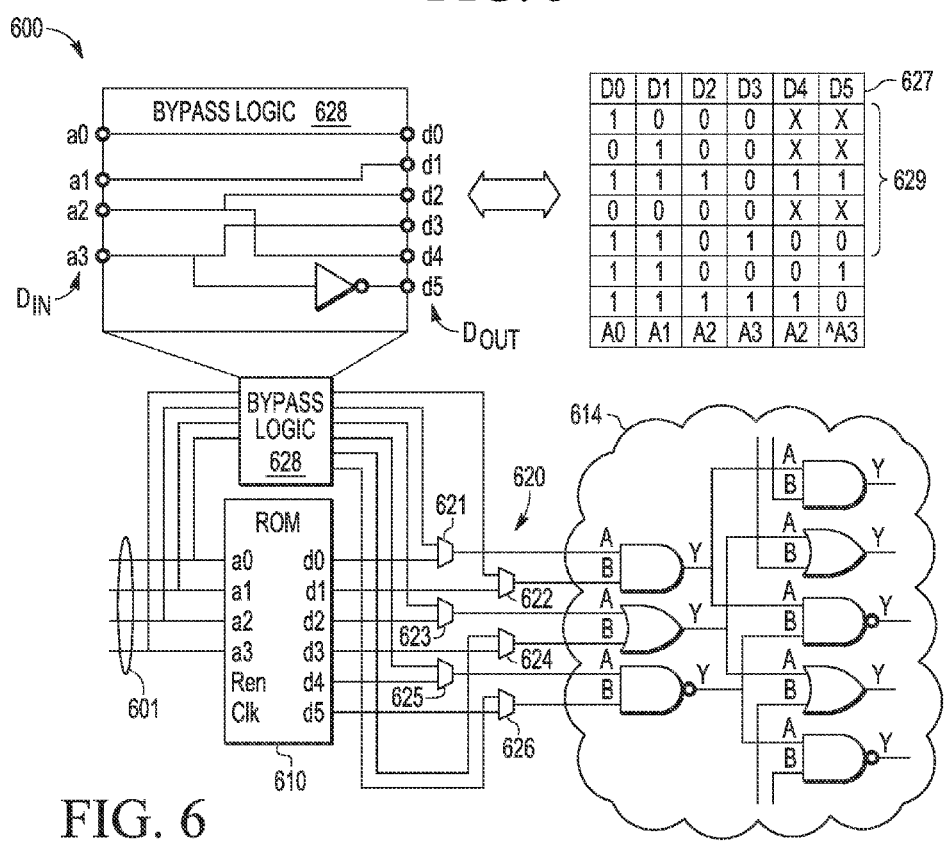
FIG. 6 illustrates a circuit schematic example of a read only memory and downstream shadow logic circuitry with a memory block matching bypass circuit which uses a logic block to generate inputs to downstream shadow logic circuitry.

For additional embodiment details, reference is now made to FIG. 6 which illustrates a simplified circuit schematic diagram of an integrated circuit system 600 which includes a read only memory 610 coupled to receive "n" ROM inputs 601 (e.g., a0, a1, a2, a3) and generate "m" ROM outputs d0, d1, d2, d3, d4, d5. In the system 600, a bypass logic block 628 and memory block matching bypass circuit 620 having multiple bypass multiplexers 621-626 are coupled to bypass "n" ROM inputs 601 around the ROM 610 and to generate one or more additional inputs to the downstream shadow logic circuitry 614. As will be appreciated, the depicted downstream shadow logic 614 under test may embody a plurality of logic gate (e.g., AND, OR, and/or NAND gates) for interfacing between the ROM 610 and external circuitry using any desired combinatorial logic function, though the depicted downstream shadow logic 614 includes two tiers of eight logic gates connected in a logic circuit characterized by 78 total stuck-at faults. In order to test the downstream shadow logic 614, the bypass logic block 628 may embody any desired combinational logic functionality for implementing a plurality of test vectors for the downstream shadow logic 614. In the example shown in FIG. 6, the bypass logic block 628 embodies combinational logic functionality shown in truth table 627 having input values (a0, a1, a2, a3, a2, and INVERSE(a3)), test vectors 629, and output values (d0, d1, d2, d3, d4, d5).

Figure 7:
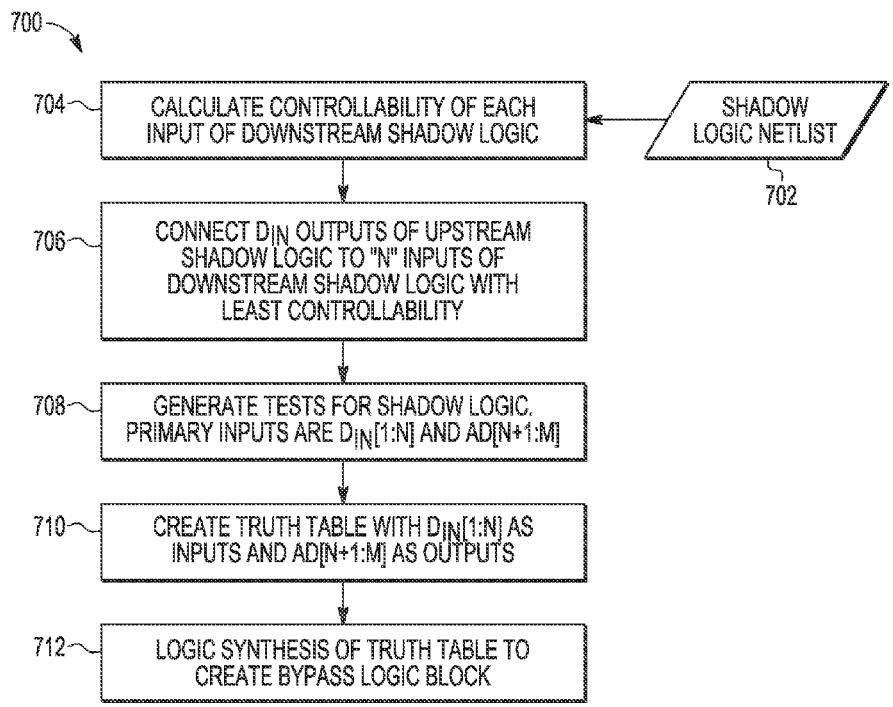
FIG. 7 illustrates a flowchart diagram for synthesizing a logic block for generating the most controllable inputs to downstream digital shadow logic circuitry.

During testing of the downstream shadow logic 614, input test data 601 (e.g., that is generated by upstream shadow logic) is routed by input multiplexer circuitry (not shown) through the bypass logic 628 and the multiplexer circuits 621-626 of the memory block matching bypass circuit 620 for input to the downstream shadow logic 614. As illustrated, the bypass logic 628 implements the logic functionality of the truth table 627 with control logic for directly passing the "n" inputs a0, a1, a2, a3 to "n" of the bypass logic outputs d0, d1, d2, d3, and for generating additional bypass logic outputs d4=a2 and d5=INVERSE(a3). At the output of the bypass logic 628, the bypass circuit 620 includes a plurality of bypass multiplexers 622, 621, 623, 625 for directly passing the "n" bypass logic outputs d0, d1, d2, d3, respectively, as inputs to the downstream shadow logic 614. The bypass circuit 620 also includes additional bypass multiplexers 624, 626 for multiplexing the additional bypass logic outputs d4=a2 and d5=INVERSE(a3), respectively, for input to the downstream shadow logic 614. For example, a first additional multiplexer 624 may retrieve the bypass logic output d4 from the bypass logic block 628, and a second additional multiplexer 626 may retrieve the bypass logic output d5 from the bypass logic block 628. Using the bypass circuit 620 and internal bypass logic 628 to bypass the ROM 610 without requiring external signal inputs, a small and limited number of test vectors (e.g., 5) may be applied to detect all 78 stuck-at faults in the downstream shadow logic 614, thereby providing 100% test coverage with improved predictability of test coverage and test vector size. In Referring now to FIG. 7, there is illustrated a flowchart diagram 700 of a sequence of algorithmic steps for synthesizing bypass logic block for generating one or more additional test inputs for downstream digital shadow logic circuitry in accordance with selected embodiments of the present disclosure (i.e., when n<m). In the disclosed methodology, the sequence starts at step 702 by retrieving the netlist for the downstream shadow logic under test.

At step 704, the retrieved netlist information is used to calculate the controllability of each of the "m" inputs to the downstream shadow logic. For example, the netlist information may be used to generate a controllability report for the inputs of the downstream shadow logic (e.g., downstream shadow logic 514 shown in FIG. 5). As will be appreciated by those skilled in the art, the controllability refers to the ability to establish a specific signal value at each input node for the downstream shadow logic, and the controllability report may be used to rank the controllability of each input node.

At step 706, the outputs of the upstream shadow logic (e.g., $D_{IN}[k]$, 1:n) are connected to "n" inputs of downstream shadow logic having the least controllability. To this end, the "n" inputs to the downstream shadow logic having the lowest controllability are assigned to receive the "n" outputs of the upstream shadow logic (e.g., $D_N[k]$, 1:n). In the example shown in FIG. 6, this results in the "n" inputs to the bypass logic 628 (e.g., a0, a1, a2, a3) being assigned to the "n" downstream shadow logic inputs having the lowest controllability (e.g., d0, d1, d2, d3).

At step 708, one or more test vectors are generated for the downstream shadow logic having "m" inputs. In the tests, the primary inputs include the "n" least controllable inputs (e.g., $D_{IN}[k]$, 1:n) and "m-n" most controllable inputs to the downstream shadow logic (e.g., AD[k]; k=n+1:m). In the example shown in FIG. 6, the resulting shadow logic test vectors 629 are shown in the truth table 627.

At step 710, a truth table is created which has outputs of the upstream shadow logic (e.g., $D_{IN}[k]$, 1:n) as truth table inputs, and the "m-n" most controllable inputs to the downstream shadow logic (e.g., AD[k]; k=n+1:m) as outputs, In the example shown in FIG. 6, the resulting truth table 627 has input values (a0, a1, a2, a3, a2, and INVERSE(a3 test vectors 629, and output values (d0, d1, d2, d3, d4, d5).

At step 712, the truth table created at step 710 is synthesized with one or more combinatorial logic gates to create the bypass logic block. In the example shown in FIG. 6, the resulting bypass logic block 628 generates bypass logic outputs d0-32 a1, d1=a1, d2=a2, d3=a3, d4=a2, and d5=INVERSE(a3). Stated more generally, the bypass logic block 628 generates $D_{OUT}[k]=D_{IN}[k]$; k=1:n, and $D_{OUT}[k]=AD[k]$; k=n+1:m.

Figure 8:
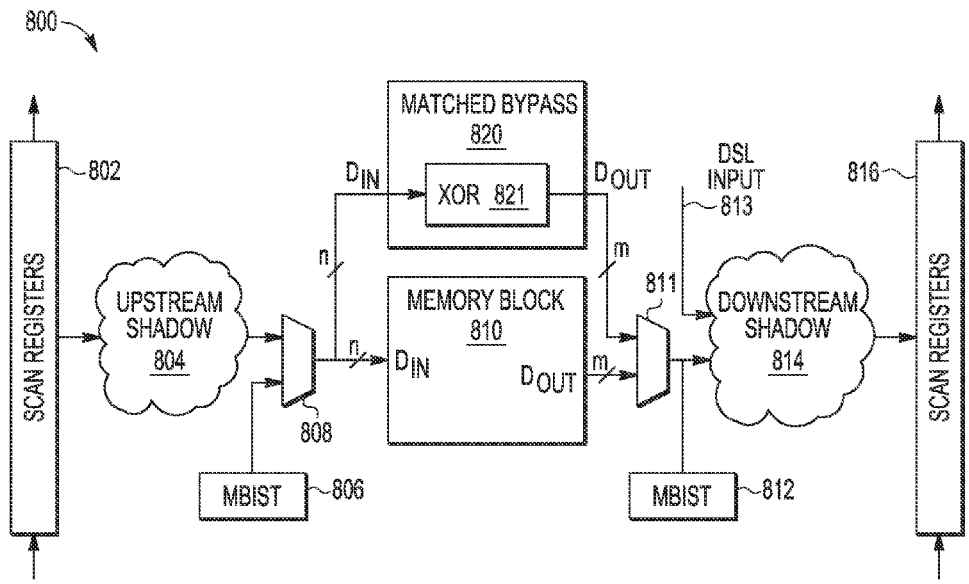
FIG. 8 illustrates a block diagram of a memory block and surrounding digital shadow logic circuitry with a memory block matching bypass circuit which includes an exclusive-OR reducer network for generating inputs to downstream digital shadow logic circuitry when testing the digital shadow logic circuitry in accordance with selected embodiments of the disclosure where the memory block input width is larger than the memory block output width.

To provide additional details for better understanding selected embodiments of the present disclosure (i.e., when n>m), reference is now made to FIG. 8 which illustrates a block diagram of an integrated circuit system 800 which includes a memory block 810 and surrounding digital shadow logic circuitry 804, 814 with a memory block matching bypass circuit 820 which includes an exclusive-OR reducer network 821 to generate inputs to downstream digital shadow logic circuitry when testing the digital shadow logic circuitry 804, 814. In the illustrated system 800, the upstream shadow logic 804 provides an n-bit input to the both the memory block 810 and the memory block matching bypass circuit 820 through the input multiplexer circuit 808 which also receives inputs from a first MBIST controller block 806. In addition, the memory block 810 and memory block matching bypass circuit 820 are each coupled to provide an m-bit output through the output multiplexer circuit 811 to the downstream shadow logic 814 and also to a second MBIST controller block 812. In this configuration, the downstream shadow logic 814 receives the m-bit data output from the output multiplexer circuit 811 and additional DSL input(s) 813 for purposes of interfacing with other circuits. The memory block matching bypass circuit 820 is connected to bypass the memory block 810 by controlling the input and output multiplexer circuits 808, 811 so that, during testing of the shadow logic 804, 814, test data may be scanned into the upstream shadow logic 804 via scan register chain 802, propagated through the circuits of upstream shadow logic 804, memory block matching bypass circuit 820 (using the input multiplexer circuit 808), and downstream shadow logic 814 (using the output multiplexer circuit 811), and then scanned out via scan register chain 816.

As described herein, flexible scan testing of the digital shadow logic circuitry 804, 814 is provided by configuring the n-input, m-output memory block matching bypass circuit 820 with an exclusive-OR reducer network 821 and any required delay circuits (not shown) to match the width and delay of the n-input, m-output memory block 810. In selected embodiments, buffers and/or flip-flop devices in the memory block matching bypass circuit 820 are used to achieve cycle count matching with the memory block 810. And in cases where the memory block input width "n" is larger than the memory block output width "m" (e.g., n>m), the "n" inputs must be reduced to a smaller set of "m" output values at the memory block matching bypass circuit 820. In such cases, the exclusive-OR reducer network 821 may be used used to achieve width matching by logically combining one or more of the "n" inputs from the upstream shadow logic 804 to generate "m" outputs for input to the downstream shadow logic 814. For example, the memory block matching bypass circuit 820 may be configured to uniquely map the "n" inputs to "m" outputs (e.g., $D_{OUT}[k]=D_{IN}[k]$ XOR $D_{IN}[k+m]$ XOR $D_{IN}[k=2m]$; k=1:m), thereby reducing the "n" inputs to "m" outputs. In an example embodiment for using a XOR reducer network with n=10 and m=1 (i.e., a 1024×4 ROM with 10 bit address and 4 bit output), the first reduced output d[0]=a[0] XOR a[4] XOR a[8], the second reduced output d[1]=a[1] XOR a[5] XOR [9], the third reduced output d[2]=a[2] XOR a[6], and the fourth reduced output d[3]=a[3] XOR [7]. With this example, all shadow logic inputs are independently controllable, and all shadow logic outputs are observable, thereby achieving 100% test coverage for shadow logic. Of course, any desired XOR reducer network or other combinatorial logic function may be used. In this configuration, one or more of the "n" memory block inputs $D_{IN}[k]$ is logically combined with one or more additional memory block inputs by the memory block matching bypass circuit 820 to generate "m" outputs from the "n" memory block inputs so that the "m" outputs are multiplexed into the downstream shadow logic circuitry 814 through the output multiplexer circuit 811.

As will be appreciated, the integrated circuit testing apparatus, system, and methodology described herein efficiently and quickly provide complete test coverage for digital shadow logic circuitry by bypassing non-logic design structures with a delay and width matched bypass circuit which flexibly emulates the non-logic design structure. In selected embodiments, the non-logic design structure may be a read only memory or other memory device. However, other non-logic design structure may be used, such as fuse circuits, analog circuits, and/or proprietary design circuits. And while the matched bypass circuit may be embodied in hardware with one or more multiplexer circuits, bypass logic circuits, XOR reducer networks, buffers, and/or flip-flop devices as described herein, selected aspects of matched bypass circuit may be programmed or loaded by processing circuitry (e.g., a processor or controller) executing software (e.g., including but not limited to firmware, resident software, microcode, etc.). Any such programming operation may be embodied in whole or in part as a computer program product accessible from a computer-usable or computer-readable medium providing program code for use by or in connection with a computer or any instruction execution system, where a computer-usable or computer readable medium can be any apparatus that may include, store, communicate, propagate, or transport the program for use by or in connection with the instruction execution system, apparatus, or device. Examples of a computer-readable medium include a semiconductor or solid state memory, magnetic tape, a removable computer diskette, a random access memory (RAM), a read-only memory (ROM), a rigid magnetic disk and an optical disk, such as a compact disk-read only memory (CD-ROM), compact disk-read/write (CD-RW) and DVD. Thus, some of the disclosed embodiments, as applicable, may be implemented using a variety of different information processing systems. For example, although FIG. 2 depicts an exemplary shadow logic test architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks and circuit structures are merely illustrative and that alternative embodiments may merge logic blocks or circuit elements or impose an alternate decomposition of functionality upon various logic blocks or circuit elements.

By now it should be appreciated that there has been provided an efficient testing apparatus, design, and methodology for testing digital shadow logic around non-logic design structures in an integrated circuit semiconductor device. In the disclosed semiconductor device, a non-logic circuit block (e.g., a memory block, fuse circuit block, or analog circuit block) is coupled to receive an n-hit input and to generate an in-bit output from the n-bit input after a first propagation delay. In addition, shadow logic is coupled to the non-logic circuit block for interfacing the non-logic circuit block with external circuitry by generating an n-bit input signal for selective connection to the n-bit input of the non-logic circuit block and by processing an m-bit output signal that may be selectively connected from the m-bit output of the non-logic circuit block to generate a shadow logic output. The semiconductor device also includes a test input control circuit (e.g., scan chain registers) for generating a multi-bit input test signal for the shadow logic with each bit of the multi-bit input test signal being independently controllable. In addition, the semiconductor device includes a bypass circuit that coupled to receive the n-bit input in a shadow logic test mode and to generate an m-bit test output from the n-bit input where the bypass circuit comprises delay matching circuitry for matching the first propagation delay of the non-logic circuit block. The delay matching circuitry may include one or more buffers, flip-flop circuits, or delay circuits to provide cycle count matching so that a propagation delay of the bypass circuit matches the first propagation delay of the non-logic circuit block. In selected embodiments, a built-in self-test (BIST) logic circuit is coupled to the bypass circuit for generating an n-bit test input signal during a shadow logic test mode. In cases where the non-logic circuit block output width is larger than the input width (e.g., m>n), the bypass circuit may include a multiplexer circuit having a first input coupled to receive the n-bit input, a second input coupled to receive an m-n bit input from an external source, and an output for generating the m-bit test output from the first and second inputs. In some embodiments, the second multiplexer input is coupled to receive the m-n bit input from one or more scan register chain storage devices coupled to an output from the shadow logic or to a built-in self-test (BIST) logic circuit. In other cases where the non-logic circuit block output width is larger than the input width (e.g., m>n), the bypass circuit may include a combiner circuit having a first input coupled to receive the n-bit input, a second input coupled to receive an m-n bit input from internal bypass logic which generates m-n bits of the m-bit output signal having the highest controllability, and an output for generating the m-bit test output from the first and second inputs. In cases where the non-logic circuit block output width is smaller than the input width (e.g., n>m), the bypass circuit may include an exclusive-OR reducer network for logically combining the n-bit input to form the m-bit test output. A signal selection circuit is coupled to the non-logic circuit block, bypass circuit, and shadow logic for selectively passing the m-bit output to the shadow logic in a first mode and passing the m-bit test output to the shadow logic in the shadow logic test mode.

In another form, there is provided a method and associated test circuit arrangement for testing the shadow logic around a memory block. In the disclosed methodology, a first test input is provided to upstream digital shadow logic which generates an n-bit output for input to a memory block, such as a read only memory, flash memory, non-volatile memory, fuse circuit block, or analog circuit block. In a shadow logic test mode, the n-bit output is selectively connected to a memory block matching bypass circuit for emulating the memory block. At the memory block matching bypass circuit, the n-bit output is processed to generate an m-bit test output from at least the n-bit output, where each bit of the m-bit test output is independently controllable and delay-matched to a propagation delay of the memory block. In selected embodiments, the n-bit output is processed at the memory block matching bypass circuit by receiving an m-n bit input from an external source (e.g., one or more scan register chain storage devices coupled to an output from the downstream digital shadow logic or included in a built-in self-test (BIST) logic circuit), and then combining the n-bit output with the m-n bit input to generate the to-bit test output when m>n. In other embodiments, the n-bit output is processed at the memory block matching bypass circuit by receiving an m-n bit input from internal bypass logic which generates m-n bits of the m-bit test output having the highest controllability, and then combining the n-bit output with the m-n bit input to generate the m-bit test output when m>n. In yet other embodiments, the n-bit output is processed at the memory block matching bypass circuit by logically combining one or more bits from the n-bit output with an exclusive-OR reducer network to generate the m-bit test output when m<n. The processing the n-bit output at the memory block matching bypass circuit may include applying the n-bit output to one or more buffers, flip-flop circuits, or delay circuits to provide cycle count matching so that a propagation delay of the memory block matching bypass circuit matches a propagation delay of the memory block. In addition, the m-bit test output is selectively connected to downstream digital shadow logic in the shadow logic test mode where a first test output is captured from the downstream digital shadow logic which is generated independently of the memory block to provide complete test coverage of the upstream and downstream digital shadow logic. The disclosed methodology may also include a memory test mode sequence whereby an n-bit memory test input from a built-in self-test (BIST) controller block is provided and selectively connected to the memory block to generate an m-bit memory test output from the memory block which is captured by the BIST controller block, where the m-bit memory test output is generated independently of the memory block matching bypass circuit to provide an isolated test of the memory block.

In yet another form, there is provided a method and associated shadow logic test circuit arrangement for generating internal bypass logic to eliminate the need for extra inputs at a bypass circuit. As disclosed, a shadow logic netlist is provided for a downstream shadow logic circuit connected to receive an m-bit input signal from a non-logic circuit block. Using the shadow logic netlist, a controllability measure is calculated for each bit of the m-bit input signal to the downstream shadow logic circuit, and the n least controllable bits of the m-bit input signal to the downstream shadow logic circuit are identified using the controllability measure calculated for each bit of the m-bit input signal. With this information, n-bits generated by an upstream shadow logic circuit are selectively connected to the n least controllable bits of the m-bit input signal to the downstream shadow logic circuit, where the upstream shadow logic circuit is connected to provide an n-bit input signal to the non-logic circuit block. In addition, one or more tests are generated for the upstream and downstream shadow logic circuits using the n-bits generated by an upstream shadow logic circuit and m-n outputs from the non-logic circuit block as inputs. In addition, a truth table is created with the n-hits generated by an upstream shadow logic circuit as inputs and m-n outputs from the non-logic circuit block as outputs. The truth table is then logically synthesized with logic to create a bypass logic block. Once the bypass logic block is created, a first test input is provided to the upstream digital shadow logic circuit which generates the n-hit input signal for the non-logic circuit block. The n-hit input signal is then selectively connected to a bypass circuit for emulating the non-logic circuit block in a shadow logic test mode. At the bypass circuit, the n-bit input signal is processed to generate an m-bit test output from at least the n-bit input signal when n<m, where each bit of the m-bit test output is independently controllable and delay-matched to a propagation delay of the non-logic circuit block. The m-bit test output is then selectively connected to the downstream digital shadow logic circuit in the shadow logic test mode, and a first test output is captured from the downstream digital shadow logic circuit which is generated independently of the non-logic circuit block to provide complete test coverage of the upstream and downstream digital shadow logic circuits.

Although the described exemplary embodiments disclosed herein are directed to hardware-based methods and systems for efficiently and quickly provide complete test coverage for digital shadow logic circuitry, the present invention is not necessarily limited to the example embodiments illustrate herein, and various embodiments of the circuitry and methods disclosed herein may be implemented with other devices and circuit components. Thus, the particular embodiments disclosed above are illustrative only and should not he taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device, comprising:
a non-logic circuit block coupled to receive an n-bit input and to generate an m-bit output from the n-bit input after a first propagation delay;
a shadow logic coupled to the non-logic circuit block for interfacing the non-logic circuit block with external circuitry by generating an n-bit input signal for selective connection to the n-bit input of the non-logic circuit block and by processing an m-bit output signal that may be selectively connected from the m-bit output of the non-logic circuit block to generate a shadow logic output;
a test input control circuit for generating a multi-bit input test signal for the shadow logic with each bit of the multi-bit input test signal being independently controllable;
a bypass circuit coupled to receive the n-bit input in a shadow logic test mode and to generate an m-bit test output from the n-bit input with each bit of the m-bit test output from the bypass circuit being independently controllable, where the bypass circuit comprises delay matching circuitry for matching the first propagation delay of the non-logic circuit block; and
a signal selection circuit coupled to the non-logic circuit block, bypass circuit, and shadow logic for selectively passing the m-bit output to the shadow logic in a first mode and passing the m-bit test output to the shadow logic in the shadow logic test mode.

2. The semiconductor device of claim 1, where the non-logic circuit block comprises a read only memory.

3. The semiconductor device of claim 1, where the non-logic circuit block comprises a memory block, fuse circuit block, or analog circuit block.

4. The semiconductor device of claim 1, further comprising a built-in self-test (BIST) logic circuit coupled to the bypass circuit for generating an n-bit test input signal during a shadow logic test mode.

5. The semiconductor device of claim 1, where the bypass circuit comprises a combiner having a first input coupled to receive the n-bit input, a second input coupled to receive an m-n bit input from an external source, and an output for generating the m-bit test output from the first and second inputs when m>n.

6. The semiconductor device of claim 5, where the second input of the combiner is coupled to receive the m-n bit input from one or more scan register chain storage devices coupled to an output from the shadow logic.

7. The semiconductor device of claim 5, where the second input of the combiner is coupled to receive the m-n bit input from one or more scan register chain storage devices including scan registers in built-in self-test (BIST) logic circuit.

8. The semiconductor device of claim 1, where the bypass circuit comprises a combiner circuit having a first input coupled to receive the n-bit input, a second input coupled to receive an m-n bit input from internal bypass logic which generates m-n most controllable bits of the m-bit test output, and an output for generating the m-bit test output from the first and second inputs when m>n.

9. The semiconductor device of claim 1, where the bypass circuit comprises an exclusive-OR reducer network for logically combining the n-bit input to form the m-bit test output when n>m.

10. The semiconductor device of claim 1, where the delay matching circuitry comprises one or more buffers, flip-flop circuits, or delay circuits to provide cycle count matching so that a propagation delay of the bypass circuit matches the first propagation delay of the non-logic circuit block.

11. A method comprising:
providing a first test input to upstream digital shadow logic which generates an n-bit output for input to a memory block;
selectively connecting the n-bit output to a memory block matching bypass circuit for emulating the memory block in a shadow logic test mode;
processing the n-bit output at the memory block matching bypass circuit to generate an m-bit test output from at least the n-bit output, where each bit of the m-bit test output from the memory block matching bypass circuit is independently controllable and delay-matched to a propagation delay of the memory block;
selectively connecting the m-bit test output to downstream digital shadow logic in the shadow logic test mode; and
capturing a first test output from the downstream digital shadow logic which is generated independently of the memory block.

12. The method of claim 11, where the memory block comprises a read only memory, flash memory, non-volatile memory, fuse circuit block, or analog circuit block.

13. The method of claim 11, further comprising:
providing an n-bit memory test input from a built-in self-test (BIST) controller block;
selectively connecting the n-bit memory test input to the memory block in a memory test mode and generating an m-bit memory test output from the memory block; and
capturing at the BIST controller block the m-bit memory test output which is generated independently of the memory block matching bypass circuit to provide an isolated test of the memory block.

14. The method of claim 11, where processing the n-bit output at the memory block matching bypass circuit comprises:
receiving an m-n bit input from an external source; and
combining the n-bit output with the m-n bit input to generate the m-bit test output when m>n.

15. The method of claim 14, where receiving the m-n bit input comprises receiving the m-n bit input from one or more scan register chain storage devices coupled to an output from the downstream digital shadow logic or included in a built-in self-test (BIST) logic circuit.

16. The method of claim 11, where processing the n-bit output at the memory block matching bypass circuit comprises:
receiving an m-n bit input from internal bypass logic which generates m-n bits of the m-bit test output having the highest controllability; and
combining the n-bit output with the m-n bit input to generate the m-bit test output when m>n.

17. The method of claim 11, where processing the n-bit output at the memory block matching bypass circuit comprises:
logically combining one or more bits from the n-bit output with an exclusive-OR reducer network to generate the m-bit test output when m<n.

18. The method of claim 11, where processing the n-bit output at the memory block matching bypass circuit comprises applying the n-bit output to one or more buffers, flip-flop circuits, or delay circuits to provide cycle count matching so that a propagation delay of the memory block matching bypass circuit matches a propagation delay of the memory block.

19. A method comprising:
calculating a controllability measure for each bit of an m-bit input signal to a downstream shadow logic circuit connected to receive the m-bit input signal from a non-logic circuit block;
identifying the n least controllable bits of the m-bit input signal to the downstream shadow logic circuit using the controllability measure calculated for each bit of the m-bit input signal;
selectively connecting n-bits generated by an upstream shadow logic circuit to the n least controllable bits of the m-bit input signal to the downstream shadow logic circuit, where the upstream shadow logic circuit is connected to provide an n-bit input signal to the non-logic circuit block;
generating one or more tests for the upstream and downstream shadow logic circuits using the n-bits generated by an upstream shadow logic circuit and m-n outputs from the non-logic circuit block as inputs;
creating a truth table with the n-bits generated by an upstream shadow logic circuit as inputs and m-n outputs from the non-logic circuit block as outputs; and
synthesizing the truth table with logic to create a bypass logic block.

20. The method of claim 19, further comprising:
providing a first test input to the upstream digital shadow logic circuit which generates the n-bit input signal for the non-logic circuit block;
selectively connecting the n-bit input signal to a bypass circuit or emulating non-logic circuit block in a shadow logic test mode;
processing the n-bit input signal at the bypass circuit to generate an m-bit test output from at least the n-bit input signal when n<m, where each bit of the m-bit test output from the bypass circuit is independently controllable and delay-matched to a propagation delay of the non-logic circuit block;
selectively connecting the m-bit test output to the downstream digital shadow logic circuit in the shadow logic test mode; and
capturing a first test output from the downstream digital shadow logic circuit which is generated independently of the non-logic circuit block to provide complete test coverage of the upstream and downstream digital shadow logic circuits.

* * * * *

UNITED STATES PATENT AND TRADEMARK OFFICE
CERTIFICATE OF CORRECTION

| | | |
|---|---|---|
| PATENT NO. | : 9,069,042 B2 | Page 1 of 1 |
| APPLICATION NO. | : 14/072295 | |
| DATED | : June 30, 2015 | |
| INVENTOR(S) | : Raina et al. | |

It is certified that error appears in the above-identified patent and that said Letters Patent is hereby corrected as shown below:

In the claims
Column 18, line 11, Claim 20 should read: "circuit for emulating the non-logic circuit block in a shadow"

Signed and Sealed this
Twentieth Day of October, 2015

Michelle K. Lee
*Director of the United States Patent and Trademark Office*